US012119277B2

(12) United States Patent
Hirano et al.

(10) Patent No.: US 12,119,277 B2
(45) Date of Patent: Oct. 15, 2024

(54) METHOD FOR PRODUCING PACKAGE SUBSTRATE FOR MOUNTING SEMICONDUCTOR DEVICE

(71) Applicant: MITSUBISHI GAS CHEMICAL COMPANY, INC., Tokyo (JP)

(72) Inventors: Syunsuke Hirano, Yamagata (JP); Yoshihiro Kato, Fukushima (JP); Takaaki Ogashiwa, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 539 days.

(21) Appl. No.: 17/413,277

(22) PCT Filed: Oct. 21, 2019

(86) PCT No.: PCT/JP2019/041289
§ 371 (c)(1),
(2) Date: Jun. 11, 2021

(87) PCT Pub. No.: WO2020/121651
PCT Pub. Date: Jun. 18, 2020

(65) Prior Publication Data
US 2022/0051958 A1 Feb. 17, 2022

(30) Foreign Application Priority Data
Dec. 14, 2018 (JP) .................. 2018-234665

(51) Int. Cl.
*H05K 3/46* (2006.01)
*H01L 21/48* (2006.01)
(Continued)

(52) U.S. Cl.
CPC ........ *H01L 23/142* (2013.01); *H01L 21/4857* (2013.01); *H01L 23/3735* (2013.01); *H05K 1/036* (2013.01); *H05K 3/4682* (2013.01)

(58) Field of Classification Search
CPC .. H05K 3/0097; H05K 3/007; H01L 21/4857; H01L 23/3735; H01L 23/49822
See application file for complete search history.

(56) References Cited

U.S. PATENT DOCUMENTS

2007/0289704 A1 12/2007 Takano et al.
2010/0096078 A1 4/2010 Nakamura et al.
(Continued)

FOREIGN PATENT DOCUMENTS

JP 2005-101137 A 4/2005
JP 2007-335700 A 12/2007
(Continued)

OTHER PUBLICATIONS

International Search Report issued in International Patent Application No. PCT/JP2019/041289, dated Dec. 24, 2019, along with English translation thereof.
(Continued)

*Primary Examiner* — Evan G Clinton
(74) *Attorney, Agent, or Firm* — GREENBLUM & BERNSTEIN, P.L.C.

(57) ABSTRACT

A method for producing a package substrate for mounting a semiconductor device includes:
forming a first substrate by forming a laminate in which a first metal layer that has a thickness of 1 μm to 70 μm and that is peelable from a core resin layer, a first insulating resin layer, and a second metal layer are arranged on both sides of the core resin layer having a thickness of 1 μm to 80 μm, and heating and pressurizing the laminate simultaneously;
forming a pattern on the second metal layer;
forming a second substrate by heating and pressurizing a laminate formed by arranging a second insulating resin layer and a third metal layer on a surface of the second metal layer; and (Continued)

peeling, from the core resin layer, a third substrate including the first metal and insulating resin layers, the second metal and insulating layers, and the third metal layer.

7 Claims, 1 Drawing Sheet

(51) Int. Cl.
*H01L 23/14* (2006.01)
*H01L 23/373* (2006.01)
*H05K 1/03* (2006.01)

(56) References Cited

U.S. PATENT DOCUMENTS

| | | |
|---|---|---|
| 2014/0020931 A1 | 1/2014 | Kobayashi |
| 2014/0085833 A1* | 3/2014 | Hsu ..................... H01L 21/4857 361/728 |
| 2019/0148169 A1 | 5/2019 | Hirano et al. |
| 2019/0181000 A1* | 6/2019 | Hirano ................ H01L 21/6835 |
| 2020/0043752 A1 | 2/2020 | Hirano et al. |

FOREIGN PATENT DOCUMENTS

| | | |
|---|---|---|
| TW | 201807750 A | 3/2018 |
| WO | 2014/046291 A1 | 3/2014 |
| WO | 2018/003703 A1 | 1/2018 |
| WO | WO-2018026004 A1 * | 2/2018 ............... G03F 7/34 |
| WO | 2018/199003 A | 3/2020 |

OTHER PUBLICATIONS

Written Opinion of the International Searching Authority issued in International Patent Application No. PCT/JP2019/041289, dated Dec. 24, 2019, along with English translation thereof.

* cited by examiner

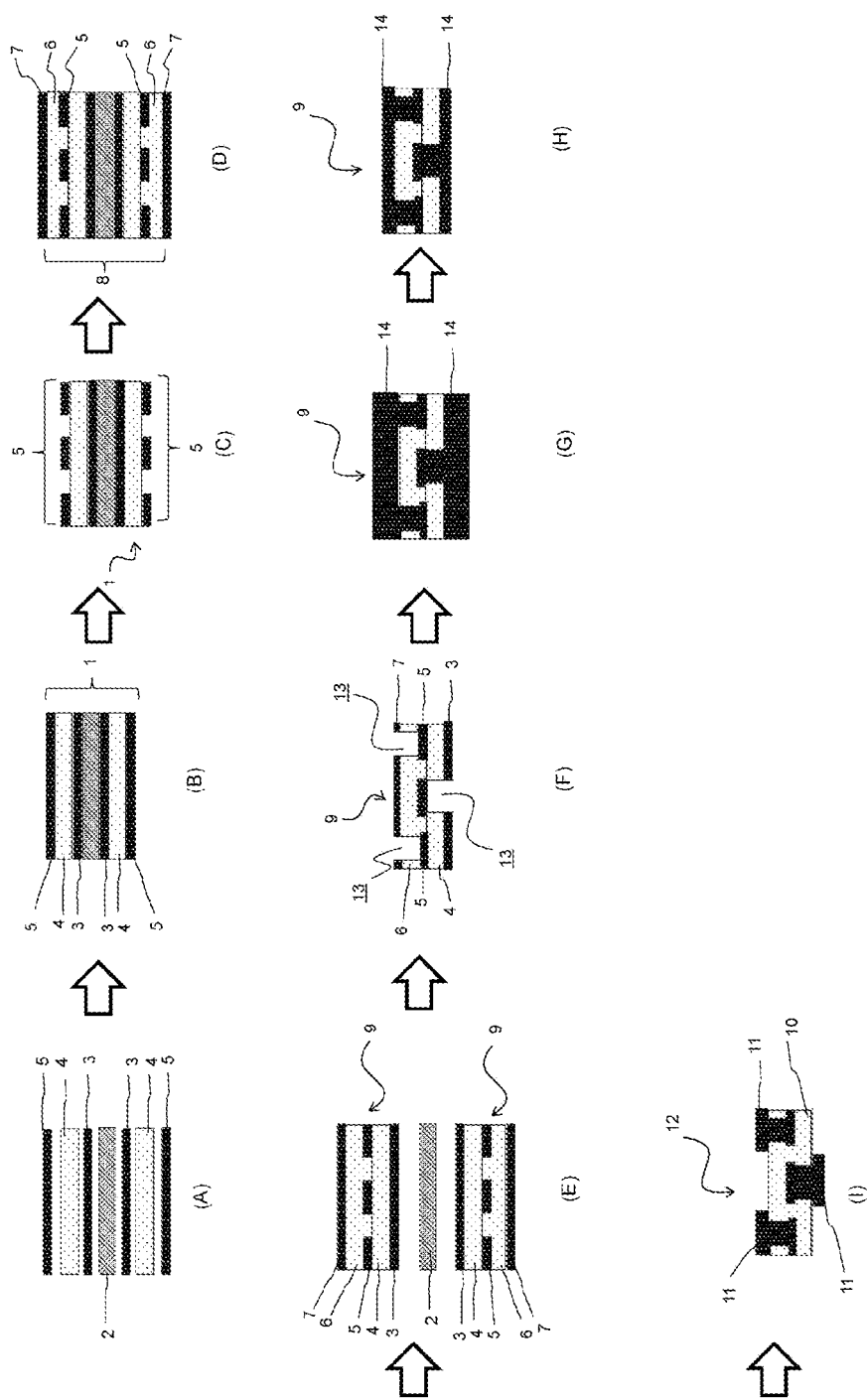

METHOD FOR PRODUCING PACKAGE SUBSTRATE FOR MOUNTING SEMICONDUCTOR DEVICE

TECHNICAL FIELD

The present invention relates to a method for producing a package substrate for mounting semiconductor device.

BACKGROUND ART

In recent years, the speed with which semiconductor packages, which are widely used in electronic devices, communication devices, personal computers, and the like, are becoming more highly functional and more compact is becoming faster and faster. Along with this, there is a demand for thinner printed wiring boards and package substrates for mounting semiconductor device in semiconductor packages. Usually, a printed wiring board and a package substrate for mounting semiconductor device are produced by laminating a layer to be a circuit pattern (hereinafter, also simply referred to as "wiring conductor") and an insulating material on a support substrate.

As a method for producing such a package substrate for mounting semiconductor device, for example, a method has been disclosed in which, using a circuit-forming substrate having a first insulating resin provided on the carrier foil surface of an ultrathin copper foil with a carrier foil, a first wiring conductor is formed by pattern electrolytic copper plating, a second insulating resin is further laminated, and then a second wiring conductor is formed (see, for example, Patent Literature 1 below). Furthermore, there has been disclosed a technique for producing a printed wiring board using a resin plate-shaped carrier and a laminated board made of a metal foil that is peelably closely adhered to at least one surface of the carrier (for example, see Patent Literature 2 below).

CITATION LIST

Patent Literature

Patent Literature 1: Japanese Patent Laid-Open No. 2005-101137
Patent Literature 2: International Publication No. 2014/046291

SUMMARY OF INVENTION

Technical Problem

As a method for producing a package substrate for mounting semiconductor device, there is known a method in which a copper-clad laminate obtained by arranging a metal foil on both sides of a core resin layer is used as a center, and an insulating layer such as a prepreg and a metal foil are built up on both sides of the copper-clad laminate to form a circuit-forming substrate. The circuit-forming substrate is also referred to as a "four-layer coreless shield plate" when it has four layers of metal foil. For example, a four-layer coreless shield plate is subsequently subjected to a patterning step or the like to become a six-layer coreless shield plate, and each substrate (laminate) provided on both sides of the core resin layer is peeled off.

Generally, in production method of a circuit-forming substrate, metal layers are arranged on both sides of the core resin layer, then a first pressing step for forming a copper-clad laminate is performed by heating and pressurizing, and then after laminating a resin layer and the like, a second pressing step is carried out to form the circuit-forming substrate.

In contrast, with the development of alignment and pressing technology, the forming of the circuit-forming substrate all at once is being considered from the viewpoint of reducing the number of steps. When the circuit-forming substrate is formed all at once, the first pressing step for forming the copper-clad laminate is omitted, and only the second pressing step is performed to form the circuit-forming substrate.

In this way, because one of the pressing steps can be omitted in the case of forming the circuit-forming substrate all at once, the efficiency of producing the circuit-forming substrate and the package substrate for mounting semiconductor device using the circuit-forming substrate can be improved. However, if the circuit-forming substrate is produced all at once, wrinkles and asperities may occur on the peeled metal foil on the core resin layer side when the substrates provided on both sides of the core resin layer are peeled from the core resin layer. A metal foil having such wrinkles and asperities causes patterning defects, and as a result, the yield of the package substrate for mounting semiconductor device may decrease when the circuit-forming substrate is are formed all at once.

The present invention solves the above-described problems, and it is an object of the present invention to provide a method for producing a package substrate for mounting semiconductor device having good production efficiency and excellent yield.

Solution to Problem

<1> A method for producing a package substrate for mounting semiconductor device comprising an insulating layer and a wiring conductor provided on the insulating layer, wherein the method comprises:

a first substrate forming step (a) of forming a first substrate by forming a laminate in which a first metal layer that has a thickness of 1 μm to 70 μm and that is peelable from a core resin layer, a first insulating resin layer, and a second metal layer are arranged in this order on both sides of the core resin layer having a thickness of 1 μm to 80 μm, and heating and pressurizing the laminate all at once;

a patterning step (b) of forming a pattern on the second metal layer of the first substrate;

a second substrate forming step (c) of forming a second substrate by heating and pressurizing a laminate formed by arranging a second insulating resin layer and a third metal layer in this order on a surface of the second metal layer of the first substrate; and a peeling step (d) of peeling, from the core resin layer, a third substrate comprising, in order, the first metal layer, the first insulating resin layer, the second metal layer, the second insulating resin layer, and the third metal layer.

<2> The method for producing a package substrate for mounting semiconductor device according to <1>, further comprising a wiring conductor forming step (e) of forming the wiring conductor by forming a non-through hole reaching a surface of the second metal layer on a surface of the third substrate, carrying out electrolytic copper plating and/or electroless copper plating on an inner wall of the non-through hole, connecting the second metal layer with each of the first metal layer and the third metal layer, forming a fourth metal layer on a surface of the third substrate, and forming a pattern on the fourth metal layer.

<3> The method for producing a package substrate for mounting semiconductor device according to <1> or <2>, wherein the third substrate has a thickness of 5 µm to 100 µm.
<4> The method for producing a package substrate for mounting semiconductor device according to any of <1> to <3>, wherein the first metal layer comprises a peeling layer, and in the laminate, the first metal layer is arranged such that the peeling layer and the core resin layer are in contact with each other.
<5> The method for producing a package substrate for mounting semiconductor device according to any of <1> to <4>, wherein the third metal layer comprises a carrier layer, and the carrier layer is removed from the third metal layer after the first substrate is heated and pressurized in the second substrate forming step (c).
<6> The method for producing a package substrate for mounting semiconductor device according to any of <1> to <5>, wherein at least any one of the first metal layer the second metal layer, and the third metal layer is a copper foil.
<7> The method for producing a package substrate for mounting semiconductor device according to any of <1> to <6>, wherein at least any one of the core resin layer, the first insulating resin layer, and the second insulating resin layer is a prepreg obtained by immersing a resin in a base material.

Advantageous Effects of Invention

According to the present invention, there can be provided a method for producing a package substrate for mounting semiconductor device having good production efficiency and excellent yield.

BRIEF DESCRIPTION OF DRAWING

FIG. 1 is a schematic view for illustrating an embodiment of the method for producing the package substrate for mounting semiconductor device of the present invention.

DESCRIPTION OF EMBODIMENT

The present invention will now be described by way of an embodiment as an example. However, the aspect of the present invention is not limited to the embodiment described below.

The method for producing a package substrate for mounting semiconductor device of the present embodiment (hereinafter, sometimes simply referred to as "the production method of the present embodiment") is a method for producing a package substrate for mounting semiconductor device comprising an insulating layer and a wiring conductor provided on the insulating layer, wherein the method comprises:

a first substrate forming step (a) of forming a first substrate by forming a laminate in which a first metal layer that has a thickness of 1 µm to 70 µm and that is peelable from a core resin layer, a first insulating resin layer, and a second metal layer are arranged in this order on both sides of the core resin layer having a thickness of 1 µm to 80 µm, and heating and pressurizing the laminate all at once;

a patterning step (b) forming a pattern on the second metal layer of the first substrate;

a second substrate forming step (c) of forming a second substrate by heating and pressurizing a laminate formed by arranging a second insulating resin layer and a third metal layer in this order on a surface of the second metal layer of the first substrate; and a peeling step (d) of peeling, from the core resin layer, a third substrate comprising, in order, the first metal layer, the first insulating resin layer, the second metal layer, the second insulating resin layer, and the third metal layer.

In the method for producing a package substrate for mounting semiconductor device of the present embodiment, a first substrate is formed by forming a laminate in which a first metal layer that has a thickness of 1 µm to 70 µm and that is peelable from a core resin layer, a first insulating resin layer, and a second metal layer are arranged in this order on both sides of the core resin layer having a thickness of 1 µm to 80 µm, and heating and pressurizing the laminate all at once. The first substrate corresponds to a circuit-forming substrate. Here, the "circuit-forming substrate" is a laminate including a core resin layer, a metal foil, and a resin layer, and means a state in which patterning or the like has not been performed on the metal foil. In the production method of the present embodiment, the first substrate (circuit-forming substrate) is formed all at once. Here, "the first substrate (circuit-forming substrate) is formed all at once" means that in the first substrate forming step (a), the first substrate (circuit-forming substrate) is formed by forming a laminate in which the first metal layer, the first insulating resin layer, and the second metal layer are arranged in this order on both sides of the core resin layer as a center, and then heating and pressurizing the laminate (carrying out a pressing step), and that the first substrate is formed by a single pressing step in which a pressing step for forming a copper-clad laminate (state in which only the first metal layer is laminated on both sides of the core resin layer) is not carried out.

Furthermore, the production method of the present embodiment uses a core resin layer having a thickness of 1 µm to 80 µm. That is, in the production method of the present embodiment, by using the core resin layer having a thickness of 1 µm to 80 µm, in the peeling step (d), the occurrence of wrinkles and asperities on the metal layer on the core resin layer side of the substrate (third substrate) peeled from the core resin layer can be suppressed even if the first substrate (circuit-forming substrate) is formed all at once. Therefore, while improving production efficiency by forming the first substrate (circuit-forming substrate) all at once, the production method of the present embodiment also suppresses the occurrence of wrinkles and asperities on the metal layer that cause patterning defects, and therefore can improve the yield of the package substrate for mounting semiconductor device.

The production method of the present embodiment will be described in detail below.

[First Substrate Forming Step (a)]

The first substrate forming step (a) is a step in which a first substrate is formed by forming a laminate in which a first metal layer that has a thickness of 1 µm to 70 µm and that is peelable from a core resin layer, a first insulating resin layer, and a second metal layer are arranged in this order on both sides of the core resin layer having a thickness of 1 µm to 80 µm, and heating and pressurizing the laminate all at once. The configuration of the first substrate (circuit-forming substrate) will now be described with reference to FIG. 1. FIG. 1 is a schematic view for illustrating an embodiment of the method for producing the package substrate for mounting semiconductor device of the present invention. As illustrated in FIGS. 1(A) and 1(B), a circuit-forming substrate (first substrate) 1 is provided with, in order from a surface side of a core resin layer 2 (for example, a prepreg), a first metal layer 3, a first insulating resin layer 4, and a second metal layer on both sides of the core resin layer 2.

In the first substrate forming step (a), the first substrate is formed by forming a laminate in which the first metal layer, the first insulating resin layer, and the second metal layer are arranged in this order on both sides of the core resin layer as a center, and then heating and pressurizing the laminate. At this time, a pressing step for forming a copper-clad laminate (state in which only the first metal layer is laminated on both sides of the core resin layer) is not carried out, and the first substrate is formed by a single pressing step after the layers up to the first insulating resin layer and the second metal layer have been laminated.

The lamination method and conditions for forming the laminate are not particularly limited, but for example, the first substrate can be formed by vacuum pressing the laminate at a temperature of 220±2° C., a pressure of 5±0.2 MPa, and a holding time of 60 minutes. In order to obtain close contact strength between each metal layer and the core resin layer or each insulating resin layer, the surface of each metal layer may be roughened. The roughening treatment is not particularly limited, and known means can be appropriately used. Examples thereof include means using a copper surface roughening solution.

(Core Resin Layer)

The core resin layer in the first substrate forming step (a) is not particularly limited, but for example, a prepreg, an insulating film material, or the like obtained by impregnating an insulating resin material (insulating material), such as a thermosetting resin, in a base material, such as a glass cloth, can be used.

The thickness of the core resin layer is 1 μm to 80 μm. If the thickness of the core resin layer is less than 1 μm, the molding of the resin is poor, and if the thickness exceeds 80 μm, when the first substrate in formed all at once, wrinkles and asperities occur on the metal layer of the third substrate surface peeled from the core resin layer after the peeling step. The thickness of the core resin layer is preferably 3 μm to 40 μm, and more preferably 10 μm to 25 μm, from the viewpoint of laminate moldability.

The "prepreg" is obtained by impregnating or coating a base material with an insulating material such as a resin composition. The base material is not particularly limited, and known materials used for various electrical insulating material laminates can be appropriately used. Examples of the material constituting the base material include inorganic fibers such as E glass, D glass, S glass, and Q glass; organic fibers such as polyimide, polyester, and tetrafluoroethylene; and mixtures thereof. The base material is not particularly limited, but for example, a material having a form such as a woven fabric, non-woven fabric, a roving, a chopped strand mat, or a surfaced mat can be appropriately used. The material and form of the base material are selected according to the intended use and performance of the molded product, and a base material of one or two or more materials and forms can be used.

The thickness of the base material is not particularly limited as long as the thickness of the core resin layer is in the range of 1 μm to 80 μm, but usually a base material having a thickness of 10 μm to 30 μm can be used. As the base material, a material that has been surface-treated with a silane coupling agent or the like or a material that has been mechanically opened can be used, and these base materials are suitable in terms of heat resistance, moisture resistance, and processability.

The insulating material is not particularly limited, and a known resin composition used as an insulating material for a printed wiring board can be appropriately selected and used. As the resin composition, a thermosetting resin having good heat resistance and chemical resistance can be used as a base. Examples of the thermosetting resin include, but are not particularly limited to, a phenolic resin, an epoxy resin, a cyanate resin, a maleimide resin, an isocyanate resin, a benzocyclobutene resin, and a vinyl resin. One type of the thermosetting resin may be used alone, or two or more types may be mixed and used.

Among the thermosetting resins, an epoxy resin can be suitably used as the insulating material because it has excellent heat resistance, chemical resistance, and electrical properties, and it is relatively inexpensive. Examples of the epoxy resin include a bisphenol A-based epoxy resin, a bisphenol F-based epoxy resin, a bisphenol S-based epoxy resin, an alicyclic epoxy resin, an aliphatic chain epoxy resin, a phenol novolac-based epoxy resin, a cresol novolac type epoxy resin, a bisphenol A novolac-based epoxy resin, a diglycidyl ether of a biphenol, a diglycidyl ether of naphthalenediol, a diglycidyl ether of a phenol, a diglycidyl ether of an alcohol, and alkyl substituents, halides, hydrogenation products and the like thereof. One type of epoxy resin may be used alone, or two or more types may be mixed and used. The curing agent used together with this epoxy resin is not limited as long as it cures the epoxy resin. Examples thereof may include a polyfunctional phenol, a polyfunctional alcohol, an amine, an imidazole compound, an acid anhydride, an organic phosphorus compound, and halides thereof. One type of these epoxy resin curing agents may be used alone, or two or more types may be mixed and used.

The cyanate resin is a resin that produces a cured product having a triazine ring as a repeating unit by heating, and the cured product has excellent dielectric properties. Therefore, the cyanate resin is suitable particularly when high frequency characteristics are required. Examples of the cyanate resin include, but are not particularly limited to, a cyanate esterified product of 2,2-bis(4-cyanatephenyl)propane, bis(4-cyanatephenyl)ethane, 2,2-bis(3,5dimethyl-4-cyanatephenyl)methane, 2,2-(4-cyanatephenyl)-1,1,1,3,3,3-hexafluoropropane, α,α'-bis(4-cyanatephenyl)-m-diisopropylbenzene, phenol novolac, and alkylphenol novolac. Among them, 2,2-bis(4-cyanatephenyl)propane is preferable because it has a particularly good balance between the dielectric properties and curability of the cured product, and is inexpensive. One type of the cyanate resin such as these cyanate ester compounds may be used alone, or two or more types may be mixed and used. In addition, the cyanate ester compound may be partially oligomerized into a trimer or a pentamer in advance.

Furthermore, a curing catalyst and a curing accelerator can be used in combination with the cyanate resin. As the curing catalyst, a metal such as manganese, iron, cobalt, nickel, copper, and zinc can be used. Specifically, examples thereof include an organometallic salt such as 2-ethylhexanate and octylate and an organometallic complex such as an acetylacetone complex. One type of the curing catalyst may be used alone, or two or more types may be mixed and used.

It is preferable to use phenols as the curing accelerator, and a monofunctional phenol such as nonylphenol and paracumylphenol, a bifunctional phenol such as bisphenol A, bisphenol F and bisphenol S, a polyfunctional phenol such as phenol novolac, cresol novolac, or the like can be used. One type of the curing accelerator may be used alone, or two or more types may be mixed and used.

The resin composition used as the insulating material can be blended with a thermoplastic resin in consideration of dielectric properties, impact resistance, film processability, and the like. Examples of the thermoplastic resin include, but are not particularly limited to, a fluororesin, polyphenylene ether, a modified polyphenylene ether, polyphenylene sulfide, polycarbonate, polyetherimide, polyether ether ketone, polyacrylate, polyamide, polyamide-imide, and polybutadiene. One type of the thermoplastic resin may be used alone, or two or more types may be mixed and used.

Among the thermoplastic resins, from the viewpoint of enabling the dielectric properties of the cured product to be improved, it is useful to use a blend of polyphenylene ether and a modified polyphenylene ether. Examples of the polyphenylene ether and the modified polyphenylene ether include poly(2,6-dimethyl-1,4-phenylene) ether, an alloyed polymer of poly(2,6-dimethyl-1,4-phenylene) ether and polystyrene, an alloyed polymer of poly(2,6-dimethyl-1,4-phenylene) ether and a styrene-butadiene copolymer, an alloyed polymer of poly(2,6-dimethyl-1,4-phenylene) ether and a styrene-maleate anhydride copolymer, an alloyed polymer of poly(3,6-dimethyl-1,4-phenylene) ether and polyamide, an alloyed polymer of poly(2,6-dimethyl-1,4-phenylene) ether and a styrene-butadiene-acrylonitrile copolymer. In order to impart reactivity and polymerizability to the polyphenylene ether, a functional group such as an amine group, an epoxy group, a carboxylic group or a styryl group may be introduced at an end of the polymer chain, or a functional group such as an amine group, an epoxy group, a carboxyl group, a styryl group, or a methacrylic group may be introduced into a polymer chain side.

Among the thermoplastic resins, a polyamide-imide resin is useful from the viewpoint of excellent moisture resistance and the adhesive agent adhering even better to the metal. The raw materials of the polyamide-imide resin are not particularly limited, but examples of the acidic component include trimellitic anhydride, and trimellitic anhydride monochloride, and examples of the amine component include meta-phenylenediamine, paraphenylenediamine, 4,4'-diaminodiphenyl ether, 4,4'-diaminodiphenylmethane, bis[4-(aminophenoxy)phenyl]sulfone, and 2,2'-bis[4-(4-aminophenoxy)phenyl]propane. The polyamide-imide resin may be modified with siloxane in order to improve a drying property, and in this case, siloxane diamine can be used as the amine component. Considering film processability, the polyamide-imide resin preferably has a molecular weight of 50,000 or more.

The above-described thermoplastic resins have been described as an insulating material mainly used for a prepreg, but these thermoplastic resins are not limited to use as a prepreg. For example, a product (film material) obtained by processing an above-described thermoplastic resin into a film may be used as the core resin layer in the above-described circuit-forming substrate.

An inorganic filler may be mixed in the resin composition used as the insulating material. Examples of the inorganic filler include, but are not particularly limited to, alumina, aluminum hydroxide, magnesium hydroxide, clay, talc, antimony trioxide, antimony pentoxide, zinc oxide, molten silica, glass powder, quartz powder, and silas balloon. One type of these inorganic fillers may be used alone, or two or more types may be mixed and used.

The resin composition used as the insulating material may contain an organic solvent. The organic solvent is not particularly limited, and solvents such as: an aromatic hydrocarbon solvent such as benzene, toluene, xylene, and trimethylbenzene; a ketone solvent such as acetone, methyl ethyl ketone, and methyl isobutyl ketone; an ether solvent such as tetrahydrofuran; an alcohol solvent such as isopropanol and butanol; an ether alcohol solvent such as 2-methoxyethanol and 2-butoxyethanol; an amide solvent such as N-methylpyrrolidone, N,N-dimethylformamide, and N,N-dimethylacetamide, and the like can be used in combination as desired. The amount of solvent in the varnish when preparing the prepreg is preferably in the range of 40 to 80% by mass with respect to the whole resin composition. The viscosity of the varnish is preferably in the range of 20 to 100 cP (20 to 100 mPa·s).

The resin composition used as the insulating material may contain a flame retardant. The flame retardant is not particularly limited, and known and customary flame retardants can be used, for example, a bromine compound such as decabromodiphenyl ether, tetrabromobisphenol A, tetrabromophthalic anhydride, and tribromophenol, a phosphorous compound such as triphenyl phosphate, trixyl phosphate, and cresyldiphenyl phosphate, a metal hydroxide such as magnesium hydroxide and aluminum hydroxide, red phosphorus and a modified product thereof, an antimony compound such as antimony trioxide and antimony pentoxide, a triazine compound such as melamine, cyanuric acid, melamine cyanurate, and the like.

Furthermore, if necessary, various additives and fillers, such as the above-described curing agent and curing accelerator, as well as thermoplastic particles, a colorant, an ultraviolet ray blocking agent, an antioxidant, a reducing agent, and the like can be added to the resin composition used as an insulating material.

In the present embodiment, the prepreg can be obtained as a prepreg in a semi-cured state (B stage state) by, for example, impregnating or coating is a resin composition (including varnish) in the base material so that the amount of the above-described resin composition adhered to the base material is 20 to 90% by mass in terms of the resin content in the prepreg after drying, and then heat drying at a temperature of 100 to 200° C. for 1 to 30 minutes. As such a prepreg, for example, the GHPL-830NSF series (product name) manufactured by Mitsubishi Gas Chemical Company can be used.

(First Metal Layer)

As the first metal layer, a metal foil that has a thickness of 1 µm to 70 µm and that is peelable from the core resin layer is used. If the thickness of the first metal layer is less than 1 µm, the molding of the first to third substrates is poorly, and if the thickness exceeds 70 µm, the surface is poor. The thickness of the first metal layer is, from the viewpoint of forming the circuit, preferably 1 µm to 12 µm, and more preferably 2 µm to 5 µm.

As described later, the third substrate is peeled from an interface between the core resin layer and the first metal layer in the peeling step. From the viewpoint of reducing peeling defects, the surface roughness of the first metal layer when peeled from the core resin layer in the peeling step (average roughness (Rzjis) of 10 points shown in JISB0601:2001) is preferably 1 µm to 3 µm, more preferably 1 µm to 2 µm, and particularly preferably 1 µm to 1.5 µm. The surface roughness of the first metal layer can be measured by, for example, cutting a 5×5 cm sample and then measuring ranges of 1×1 cm with a VR-3100 microscope (manufactured by Keyence).

As the first metal layer, for example, a copper foil can be used. As the copper foil, for example, a peelable type can be used. The "peelable type" copper foil is an ultrathin copper foil having a peeling layer. The peeling layer is, for example, a copper foil that can be peeled off. When a peelable type copper foil is used, the first metal layer is laminated so that the peeling layer is in contact with the core resin layer.

Examples of the peeling layer include a layer containing at least a silicon compound. The peeling layer can be formed by, for example, applying a silicon compound composed of a single silane compound or a plurality of silane compounds on a copper foil or an ultrathin copper foil. The means for applying the silicon compound are not particularly limited, and for example, a known means such as coating can be used. A rust preventive treatment (to form a rust preventive treatment layer) can be carried out on the adhesive surface of the copper foil with the peeling layer. The rust preventive treatment can be carried out using any of nickel, tin, zinc, chromium, molybdenum, and cobalt, or an alloy thereof.

The thickness of the peeling layer is not particularly limited, but from the viewpoint of removability and peelability, is preferably 5 nm to 100 nm, more preferably 10 nm to 80 nm, and particularly preferably 20 nm to 60 nm.

(First Insulating Resin Layer)

As the first insulating resin layer, the same material as the above-described core resin layer (for example, prepreg) can be used. The thickness of the first insulating resin layer is appropriately set as desired, and is not particularly limited, but may be, for example, 10 µm to 100 µm, preferably 10 µm to 50 µm, and more preferably 10 µm to 30 µm.

(Second Metal Layer)

As the second metal layer, for example, the same material as the above-described first metal layer (for example, copper foil) can be used. Since the thickness of the second metal layer is appropriately set as desired, and is not particularly limited, it can be, for example, 2 µm to 70 µm, preferably 2 µm to 18 µm, and more preferably 2 µm to 12 µm.

As the second metal layer, for example, an ultrathin copper foil with a carrier can be used. In this case, the second metal layer is arranged so that the copper foil or the like is in contact with the second insulating resin layer, and the carrier is peeled off after the first substrate is formed by heating and pressurizing.

[Patterning Step (b)]

The patterning step (b) is a step of forming a pattern on the second metal layer of the above-described first substrate (circuit-forming substrate). By performing the patterning step (b), as illustrated in FIG. 1(C), a pattern is formed on a second metal layer 5 of the circuit-forming substrate 1. The means for forming the pattern of the second metal layer are not particularly limited, but can be carried out formed by, for example, the following steps.

The patterning step (b) is not particularly limited, but can be carried out by, for example, cleaning and conditioning the surface of the second metal layer, laminating a dry film resist or the like, attaching a negative mask, then printing the circuit pattern with an exposure machine, and developing the dry film resist with a developing solution to form an etching resist. After that, a pattern can be formed on the second metal layer by performing an etching treatment to remove the copper in the portion without the etching resist with an aqueous solution of ferric chloride and the like, and then removing the resist.

The above-described resist is not particularly limited, and for example, a known resist, such as a commercially available dry film resist, can be appropriately selected and used. The photolithography (including exposure, development, and removal of the resist) when forming the pattern on the second metal layer is not particularly limited, and can be carried out using known means and equipment.

The pattern width of the second metal layer is not particularly limited, and the width can be appropriately selected depending on the intended use. For example, the width can be set to 5 to 100 µm, and preferably 10 to 30 µm.

[Second Substrate Forming Step (c)]

The second substrate forming step (c) is a step of forming a second substrate by heating and pressurizing a laminate formed by arranging a second insulating resin layer and a third metal layer in this order on a surface of the second metal layer of the first substrate. By carrying out the second substrate forming step (c), as illustrated in FIG. 1(D), a second substrate 8 can be obtained in which a second insulating resin layer 6 and a third metal layer 7 are laminated on the second metal layer 5.

(Second Insulating Resin Layer)

As the second insulating resin layer, the same material as the above-described core resin layer (for example, prepreg) can be used. The thickness of the second insulating resin layer is appropriately set as desired, and is not particularly limited, but may be, for example, 10 µm to 100 µm, preferably 10 µm to 50 µm, and more preferably 10 µm to 30 µm.

(Third Metal Layer)

As the third metal layer, for example, the same material as the above-described first metal layer (for example, copper foil) can be used. Since the thickness of the third metal layer is appropriately set as desired, and is not particularly limited, it can be, for example, 2 µm to 70 µm, preferably 2 µm to 18 µm, and more preferably 2 µm to 5 µm.

Furthermore, as the third metal layer, for example, an ultrathin copper foil with a carrier can be used. In this case, the third metal layer is arranged so that the copper foil or the like is in contact with the second insulating resin layer, and the carrier is peeled off after the second substrate is formed by heating and pressurizing.

(Laminating Method/Conditions)

The method and conditions for laminating the second insulating resin layer and the third metal layer in that order to obtain the second substrate are not particularly limited, but for example, the second substrate can be formed by laminating the second insulating resin layer and the third metal layer on the first substrate, then vacuum-pressing at a temperature of 220±2° C., a pressure of 5±0.2 MPa, and a holding time of 60 minutes. In order to obtain close contact strength between the second metal layer and the second insulating resin layer, the surface of the second metal layer may be roughened.

[Peeling Step (d)]

The peeling step (d) is a step of peeling, from the core resin layer, a third substrate comprising, in order, the first metal layer, the first insulating resin layer, the second metal layer, the second insulating resin layer, and the third metal layer. After the peeling step (d), as illustrated in FIG. 1(E), the second substrate is separated at the interface between the core resin layer 2 and the first metal layer 3 arranged on both sides thereof. As a result, two third substrates 9 can be obtained having, in order, a first metal layer 3, a first insulating resin layer 4, a second metal layer 5, a second insulating resin layer 6, and a third metal layer 7.

Since the thickness of the third substrate is appropriately set as desired, and is not particularly limited, it can be, for example, 5 µm to 400 µm, preferably 5 µm to 200 µm, and more preferably 5 µm to 100 µm.

In the peeling step (d), it is preferable that the core resin layer is peeled off at the interface between the core resin layer and the first metal layer. For example, when the first metal layer has a peeling layer, a part of the peeling layer may be peeled off together with the core resin layer. Also included is an aspect in which, at the interface between the peeling layer of the first metal layer and the copper foil, the core resin layer is peeled off together with the peeling layer. When the peeling layer remains on the first metal layer, the peeling layer can be removed by using, for example, a sulfuric acid-based or hydrogen peroxide-based etching solution. The sulfuric acid-based or hydrogen peroxide-based etching solution is not particularly limited, and solutions that are used in the art can be used.

[Wiring Conductor Forming Step (e)]

The production method of the present embodiment can also further include a wiring conductor forming step (e) of forming the wiring conductor by forming a non-through hole reaching a surface of the second metal layer on a surface of the third substrate, carrying out electrolytic copper plating and/or electroless copper plating on an inner wall of the non-through hole, connecting the second metal layer with each of the first metal layer and the third metal layer, forming a fourth metal layer on a surface of the third substrate, and forming a pattern on the fourth metal layer. By carrying out the wiring conductor forming step (e), as illustrated in FIG. 1(I), a package substrate for mounting semiconductor device 12 can be obtained in which a wiring conductor 11 is formed on both sides of an insulating layer 10. The insulating layer 10 is composed of the first insulating resin layer 4 and the second insulating resin layer 6, and the wiring conductor 11 is formed by interconnecting each of the patterned first metal layer 3, second metal layer 5, third metal layer 7 by electrolytic copper plating and/or electroless copper plating.

(Formation of Non-Through Holes)

In the wiring conductor forming step (e), non-through holes reaching the surface of the second metal layer are formed on the surface of the third substrate. As illustrated in FIG. 1(F), a non-through hole(s) 13 is/are provided on both sides of the third substrate 9. That is, from the upper side illustrated in FIG. 1(F), non-through holes 13 are formed in the second insulating resin layer 6 through the third metal layer 7. Similarly, from the lower side illustrated in FIG. 1(F), a non-through hole 13 is formed in the first insulating resin layer 4 through the first metal layer 3.

The means for forming the non-through holes are not particularly limited, and for example, known means such as a laser, for example, a carbon dioxide laser, or a drill can be used. The number and size of the non-through holes can be appropriately selected as desired. After the non-through holes are formed, a desmear treatment can be performed using an aqueous solution of sodium permanganate or the like.

(Interconnection and Formation of Fourth Metal Layer)

In the wiring conductor forming step (e), as illustrated in FIG. 1(G), after the non-through holes 13 are formed, electrolytic copper plating and/or electroless copper plating may be carried out to form a copper plating film on the inner walls of the non-through holes 13, to electrically connect the patterned first metal layer 3, second metal layer 5, and third metal layer 7 to each other. The electrolytic copper plating and/or electroless copper plating increases the thickness of the first and third metal layers on both sides of the third substrate to form the fourth metal layer 14. The method for carrying out the electrolytic copper plating and/or electroless plating is not particularly limited, and a known method can be employed. The copper plating may be either electrolytic copper plating or electroless plating, but it is preferable to carry out both electrolytic copper plating and electroless plating.

(Film Thickness Adjustment)

In the wiring conductor forming step (e), as illustrated in FIG. 1(H), after the electrolytic/electroless copper plating treatment, the film thickness of the fourth metal layer 14 can be adjusted by optionally carrying out a known treatment, such as an etching treatment, so that the fourth metal layer 14 has a desired thickness.

Since the thickness of the adjusted fourth substrate is appropriately set as desired, and is not particularly limited, it can be, for example, 5 µm to 30 µm, preferably 5 µm to 20 µm, and more preferably 5 µm to 12 µm.

(Patterning)

The wiring conductor forming step (e) can be carried out by, for example, optionally cleaning and conditioning the surface of the fourth metal layer 14, then laminating a dry film resist or the like, attaching a negative mask, then printing the circuit pattern with an exposure machine, and developing the dry film resist with a developing solution to form an etching resist. After that, the wiring conductor 11 can be formed on both sides of the insulating layer 10 by, as illustrated in FIG. 1(I), performing an etching treatment to remove the copper in the portion without the etching resist with an aqueous solution of ferric chloride and the like, and then removing the resist.

Examples of the method for interconnecting the layers that can be applied in the present embodiment include a method in which a blind via portion formed by a known laser is chemically plated with copper (method in which a wiring circuit is formed by laser processing, then patterned by chemical copper plating to interconnect the layers), a method in which the entire insulating layer is pierced by a metal bump (preferably a copper bump) formed by etching a plating or a metal foil onto a connecting portion in advance, as well as a method in which a bump consisting of a metal paste containing a metal filler such as solder, silver, and copper in an insulating resin is printed onto a predetermined location by screen printing or the like, then the paste is cured by drying, and heating and pressurizing are carried out to ensure electrical continuity between the inner and outer layers.

In FIG. 1, in which the present embodiment is exemplified, a package substrate for mounting semiconductor device 12 is a package substrate for mounting semiconductor device having a three-layer structure, but the present invention is not limited thereto, and a package substrate for mounting semiconductor device having an even more built-up structure, such as a five-layer structure, can also be formed. For example, in the wiring conductor forming step (e), after the wiring conductor is formed, it is possible to further laminate an insulating resin layer and a metal layer, and repeat the patterning and interconnection of the layers to obtain a package substrate for mounting semiconductor device that has a built-up structure.

<Method for Producing Package Substrate for Mounting Semiconductor Device>

In the method for producing a package substrate for mounting semiconductor device of the present embodiment, after the package substrate for mounting semiconductor device is formed as described above, a semiconductor device such as a bare chip can be loaded as desired.

The semiconductor device is not particularly limited, and a desired semiconductor device can be appropriately used. For example, a bare chip or the like on which a gold bump has been formed on an aluminum electrode portion by a ball bonding method of a gold wire can be used. The semiconductor device can be loaded via a bonding material onto the wiring conductor of the package substrate for mounting semiconductor device. The bonding material is not particularly limited as long as it has conducive means, but for example, solder or the like (for example, solder balls, solder paste, etc.) can be used. Furthermore, the semiconductor device can be loaded via the bonding material after surface-treating the wiring conductor of the package substrate for mounting semiconductor device. The surface treatment is not particularly limited, and examples thereof include formation of a nickel layer or a gold plating layer. When solder is used as the bonding material, a process such as reflow can be performed after the semiconductor device is loaded on the wiring conductor. At this time, the reflow temperature is appropriately selected depending on the melting point and the like of the bonding material, and can be, for example, 260° C. or more.

EXAMPLES

The production method of the present invention will now be specifically described with reference to examples.

Comparative Example 1

A copper foil obtained by coating a release layer (product name: PCS, manufactured by JX Nippon Mining & Metals Corporation) on a 2 μm-thick copper foil was arranged on both sides of a B stage prepreg (core resin layer; thickness 0.087 mm; GHPL-830NSF FX64, manufactured by Mitsubishi Gas Chemical Company) obtained by impregnating a glass cloth (glass fiber) with bismaleimide triazine resin (BT resin) so that the peeling layer surface adhered to the prepreg. Then, onto that a 12 μm copper foil (product name: 3EC-VLP, manufactured by Mitsui Mining & Smelting Co., Ltd.) was laminated by vacuum pressing at a pressure of 2.5±0.2 MPa, a temperature of 220±2° C., and a holding time of 60 minutes through a B stage prepreg (thickness 0.025 mm; GHPL-830NSF FF70, manufactured by Mitsubishi Gas Chemical Company) obtained by impregnating a glass cloth (glass fiber) with bismaleimide triazine resin (BT resin).

The surface of the obtained substrate was cleaned and conditioned, and a dry film resist (product name: NIT225, manufactured by Nichigo-Morton Co., Ltd.) was laminated at a temperature of 110±10° C. and a pressure of 0.50±0.02 MPa. Then, a negative mask was attached, a circuit pattern was printed with a parallel exposure machine, the dry film resist was developed with an aqueous solution of 1% sodium carbonate to form an etching resist, and the copper in the portion without the etching resist was removed with an aqueous solution of ferric chloride. Then, the dry film resist was removed with an aqueous solution of sodium hydroxide to form a circuit pattern.

The surface of the substrate on which the circuit pattern was formed was roughened using a copper surface roughening solution (product name: CZ-8100, manufactured by MEC Company Ltd.), a B stage prepreg (thickness 0.025 mm; GHPL-830NSF FF70, manufactured by Mitsubishi Gas Chemical Company) obtained by impregnating a glass cloth (glass fiber) with bismaleimide triazine resin (BT resin) was arranged on both sides of the roughened substrate, and onto that a 2 μm copper foil with an 18 μm carrier copper foil (product name: MTEx, manufactured by Mitsui Mining & Smelting Co., Ltd.) was laminated by vacuum pressing at a pressure of 2.5±0.2 MPa, a temperature of 220±2° C., and a holding time of 60 minutes. Then, the 18 μm carrier copper foil was peeled off.

The obtained substrate was peeled by applying a physical force to the boundary portion between the core resin layer, the PCS, and the copper foil. However, there were many asperities on the copper foil surface of the peeling surface, and the yield decreased during laser processing and circuit formation.

Example 1

<First Substrate Forming Step (a)>

A copper foil with a peeling layer (first metal layer 3 in FIG. 1(A)) obtained by coating a release layer (product name: PCS, manufactured by JX Nippon Mining & Metals Corporation) on a 2 μm-thick copper foil was arranged on both sides of a B stage prepreg (core resin layer 2 in FIG. 1(A); thickness 25 μm; GHPL-830NSF FF70, manufactured by Mitsubishi Gas Chemical Company) obtained by impregnating a glass cloth (glass fiber) with bismaleimide triazine resin (BT resin) so that the peeling layer surface was in contact with the core resin layer. Then, a B stage prepreg (first insulating resin layer 4 in FIG. 1(A); thickness 0.025 μm; GHPL-830NSF FF70, manufactured by Mitsubishi Gas Chemical Company) obtained by impregnating a glass cloth (glass fiber) with bismaleimide triazine resin (BT resin) was arranged thereon, and onto that a 12 μm copper foil (second metal layer 5 in FIG. 1(A); product name: 3EC-VLP, manufactured by Mitsui Mining & Smelting Co., Ltd.) was laminated by vacuum pressing at a pressure of 2.5±0.2 MPa, a temperature of 220±2° C., and a holding time of 60 minutes to produce a first substrate (circuit-forming substrate (first substrate) 1 in FIG. 1(B)).

<Patterning Step (b)>

Next, the surface of the first substrate was cleaned and conditioned, and a dry film resist (product name: NIT225, manufactured by Nichigo-Morton Co., Ltd.) was laminated on the surface of the second metal layer at a temperature of 110±10° C. and a pressure of 0.50±0.02 MPa. Then, a negative mask was attached thereon, a circuit pattern was printed with a parallel exposure machine, the dry film resist was developed with an aqueous solution of 1% sodium carbonate to form an etching resist, and the copper in the portion without the etching resist was removed with an aqueous solution of ferric chloride. Then, the dry film resist was removed with an aqueous solution of sodium hydroxide to form a pattern on the second metal layer 5 (see FIG. 1(C)).

<Second Substrate Forming Step (c)>

Next, the surface of the patterned second metal layer 5 was roughened using a copper surface roughening solution (product name: CZ-8100, manufactured by MEC Company Ltd.), a B stage prepreg (second insulating resin layer 6 in FIG. 1(D); thickness 0.025 mm; GHPL-830NSF FF70, manufactured by Mitsubishi Gas Chemical Company) obtained by impregnating a glass cloth (glass fiber) with bismaleimide triazine resin (BT resin) was arranged on the surface of the second metal layer 5 provided on both sides of the circuit-forming substrate 1, and onto that a 2 μm copper foil with an 18 μm carrier copper foil (third metal layer 7 in FIG. 1(D); product name: MTEx, manufactured by Mitsui Mining & Smelting Co., Ltd.) was laminated by vacuum pressing at a pressure of 2.5±0.2 MPa, a temperature of 220±2° C., and a holding time of 60 minutes. Then, the 18 μm carrier copper foil was peeled off to produce a second substrate (second substrate 8 in FIG. 1(D)).

<Peeling Step (d)>

A third substrate (third substrate 9 in FIG. 1(E)) was peeled off and obtained by applying a physical force to the boundary portion between the copper foil with a peeling layer (first metal layer 3) and the prepreg (core resin layer 2) in the second substrate. The asperities on the copper foil surface of the peeling surface were measured by the following method. The asperities on the copper foil surface of the peeling surface were 2.25 μm.

The asperities on the copper foil surface of the peeling surface were measured. To measure the surface asperities, a VR-3100 microscope (manufactured by Keyence) was used, and the measurement was carried out by measuring a 1×1 cm range of a sample cut to 5×5 cm.

<Wiring Conductor Forming Step (e)>

Holes were individually bored on both sides of the third substrate using a carbon dioxide laser equipment (product name: LC-1C/21, manufactured by Hitachi Via Mechanics, Ltd.) at a beam irradiation diameter of Φ0.21 mm, a frequency of 500 Hz, and a pulse width of 10 μs to form non-through holes (non-through holes 13 in FIG. 1(F)) on both sides of the third substrate. Then, a desmear treatment was performed using an aqueous solution of sodium permanganate at a temperature of 80±5° C. and a concentration of 55±10 g/L.

Furthermore, a plating treatment to a thickness of 0.4 to 0.8 μm was carried out by electroless copper plating, and then plating to a thickness of 8 μm was carried out by electrolytic copper plating to form a fourth metal layer (fourth metal layer 14 in FIG. 1(G)). As a result, the first and third metal layers were electrically connected by the non-through holes via the second metal layer. Next, the surface of the fourth metal layer was cleaned and conditioned, and a dry film resist (product name: NIT225, manufactured by Nichigo-Morton Co., Ltd.) was laminated at a temperature of 110±10° C. and a pressure of 0.50±0.02 MPa. Then, a negative mask was attached, a circuit pattern was printed with a parallel exposure machine, the dry film resist was developed with an aqueous solution of 1% sodium carbonate to form an etching resist, and the copper in the portion without the etching resist was removed with an aqueous solution of ferric chloride. Then, the dry film resist was removed with an aqueous solution of sodium hydroxide to form a pattern on the fourth metal layer, to thereby produce a package substrate for mounting semiconductor device (package substrate for mounting semiconductor device 12 in which wiring conductors 11 are formed on both sides of the insulating layer 10 in FIG. 1(I)).

The obtained package substrate for mounting semiconductor device was subjected to solder resist forming treatment and gold plating finish, and cutting processing to the package size to obtain the package substrate for mounting semiconductor device of Example 1.

Example 2

A package substrate for mounting semiconductor device was obtained in the same manner as in Example 1, except that, as the core resin layer 2 in Example 1, a B stage prepreg (GHPL-830NSF FF67, manufactured by Mitsubishi Gas Chemical Company; thickness 20 μm) obtained by impregnating a glass cloth (glass fiber) with bismaleimide triazine resin (BT resin) was used. The asperities on the copper foil surface of the peeling surface were measured by the same method as in Example 1. The asperities on the copper foil surface of the peeling surface were 1.79 μm.

Example 3

A package substrate for mounting semiconductor device was obtained in the same manner as in Example 1, except that, as the core resin layer 2 in Example 1, a B stage prepreg (GHPL-830NSF FF74, manufactured by Mitsubishi Gas Chemical Company; thickness 30 μm) obtained by impregnating a glass cloth (glass fiber) with bismaleimide triazine resin (BT resin) was used. The asperities on the copper foil surface of the peeling surface were measured by the same method as in Example 1. The asperities on the copper foil surface of the peeling surface were 3.15 μm.

Example 4

A package substrate for mounting semiconductor device was obtained in the same manner as in Example 1, except that, as the core resin layer 2 in Example 1, a B stage prepreg (GHPL-830NSF FF78, manufactured by Mitsubishi Gas Chemical Company; thickness 35 μm) obtained by impregnating a glass cloth (glass fiber) with bismaleimide triazine resin (BT resin) was used. The asperities on the copper foil surface of the peeling surface were measured by the same method as in Example 1. The asperities on the copper foil surface of the peeling surface were 3.32 μm.

In the package substrates for mounting semiconductor device of Examples 1 to 4, the circuit-forming substrate (first substrate) was formed all at once, and therefore the production efficiency was higher than in the Comparative examples, and there were few defects and an excellent yield in terms of the yield during laser processing and circuit formation.

Comparative Example 2

A package substrate for mounting semiconductor device was obtained in the same manner as in Example 1, except that, as the core resin layer 2 in Example 1, a B stage prepreg (GHPL-830NXA, manufactured by Mitsubishi Gas Chemical Company; thickness 110 μm) obtained by impregnating a glass cloth (glass fiber) with bismaleimide triazine resin (BT resin) was used. The asperities on the copper foil surface of the peeling surface were measured by the same method as in Example 1. The asperities on the copper foil surface of the peeling surface were 6.00 μm, resist close contact in circuit formation in the next step deteriorated, and the product yield decreased.

The disclosure of Japanese Patent Application No. 2018-2346665 filed on Dec. 14, 2018, is incorporated herein by reference in its entirety.

All reference documents, patent applications, and technical standards described in the specification are incorporated by reference herein to the same extent as if each of those reference documents, patent applications, and technical standards were specifically and individually described as being incorporated by reference.

REFERENCE SIGNS LIST 1 circuit-forming substrate (first substrate)
2 core resin layer
3 first metal layer
4 first insulating resin layer
5 second metal layer
6 second insulating resin layer
7 third metal layer
8 second substrate
9 third substrate
10 insulating layer
11 wiring conductor
12 package substrate for mounting semiconductor device
13 non-through hole
14 fourth metal layer

The invention claimed is:

1. A method for producing a package substrate for mounting a semiconductor device comprising an insulating layer and a wiring conductor provided on the insulating layer, wherein the method comprises:

forming a first substrate with a single pressurizing by forming a laminate in which a first metal layer that has a thickness of 1 µm to 70 µm and that is peelable from a core resin layer, a first insulating resin layer, and a second metal layer in this order on both sides of the core resin layer having a thickness of 1 µm to 80 µm, then heating and pressurizing the laminate, wherein the heating is during the pressurizing, and no other pressing is performed before after the heating and pressurizing during the forming of the first substrate;

forming a pattern on the second metal layer of the first substrate;

forming a second substrate by heating and pressurizing a laminate formed by arranging a second insulating resin layer and a third metal layer in this order on a surface of the second metal layer of the first substrate; and peeling, from the core resin layer, a third substrate comprising, in order, the first metal layer, the first insulating resin layer, the second metal layer, the second insulating resin layer, and the third metal layer.

2. The method for producing the package substrate for mounting the semiconductor device according to claim 1, further comprising forming the wiring conductor by forming a non-through hole reaching a surface of the second metal layer on a surface of the third substrate, carrying out electrolytic copper plating and/or electroless copper plating on an inner wall of the non-through hole, connecting the second metal layer with each of the first metal layer and the third metal layer, forming a fourth metal layer on a surface of the third substrate, and forming a pattern on the fourth metal layer.

3. The method for producing the package substrate for mounting the semiconductor device according to claim 1, wherein the third substrate has a thickness of 5 µm to 100 µm.

4. The method for producing the package substrate for mounting the semiconductor device according to claim 1, wherein the first metal layer comprises a peeling layer, and in the laminate, the first metal layer is arranged such that the peeling layer and the core resin layer are in contact with each other.

5. The method for producing the package substrate for mounting the semiconductor device according to claim 1, wherein the third metal layer comprises a carrier layer, and the carrier layer is removed from the third metal layer after the first substrate is heated and pressurized in the forming of the second substrate.

6. The method for producing the package substrate for mounting the semiconductor device according to claim 1, wherein at least any one of the first metal layer, the second metal layer, and the third metal layer is a copper foil.

7. The method for producing the package substrate for mounting the semiconductor device according to claim 1, wherein at least any one of the core resin layer, the first insulating resin layer, and the second insulating resin layer is a prepreg obtained by immersing a resin in a base material.

* * * * *

UNITED STATES PATENT AND TRADEMARK OFFICE
CERTIFICATE OF CORRECTION

PATENT NO. : 12,119,277 B2
APPLICATION NO. : 17/413277
DATED : October 15, 2024
INVENTOR(S) : S. Hirano et al.

Page 1 of 1

It is certified that error appears in the above-identified patent and that said Letters Patent is hereby corrected as shown below:

In the Claims

Column 17, Line 14 (Claim 1, Line 13), please change "before after the" to -- before the --.

Signed and Sealed this
Eleventh Day of February, 2025

Coke Morgan Stewart
*Acting Director of the United States Patent and Trademark Office*